(12) United States Patent
Park et al.

(10) Patent No.: US 10,541,381 B2
(45) Date of Patent: Jan. 21, 2020

(54) ORGANIC LIGHT-EMITTING DEVICE AND ORGANIC LIGHT-EMITTING DISPLAY DEVICE

(71) Applicant: LG DISPLAY CO., LTD., Seoul (KR)

(72) Inventors: Joon-Won Park, Seoul (KR); Moo-Chan Kang, Seoul (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 16/190,239

(22) Filed: Nov. 14, 2018

(65) Prior Publication Data

US 2019/0157618 A1    May 23, 2019

(30) Foreign Application Priority Data

Nov. 22, 2017 (KR) .................. 10-2017-0156596

(51) Int. Cl.
  *H01L 51/52*     (2006.01)
  *H01L 27/32*     (2006.01)
(52) U.S. Cl.
  CPC ...... *H01L 51/5259* (2013.01); *H01L 51/5253* (2013.01); *H01L 27/3246* (2013.01)

(58) Field of Classification Search
  CPC . H01L 51/56; H01L 51/5012; H01L 51/0097; H01L 27/3246; H01L 51/5072
  USPC ......................................................... 257/40
  See application file for complete search history.

(56) References Cited

U.S. PATENT DOCUMENTS

2016/0268540 A1*  9/2016  Kim ................ H01L 51/5246

* cited by examiner

*Primary Examiner* — Andy Huynh
(74) *Attorney, Agent, or Firm* — Polsinelli PC

(57) ABSTRACT

Disclosed are an organic light-emitting device and an organic light-emitting display device capable of improving reliability thereof. The organic light-emitting device or the organic light-emitting display device includes an organic encapsulation layer disposed on a light-emitting element, and the organic encapsulation layer includes a first organic encapsulation layer disposed on an inorganic encapsulation layer and a second organic encapsulation layer disposed so as to surround the first organic encapsulation layer and including a moisture-absorbent material. As such, it is possible to achieve a reduction in cost and to prevent moisture or oxygen from being introduced from the outside into the side surface of the organic light-emitting device.

20 Claims, 8 Drawing Sheets

T1        T2

T1        T2

ORGANIC LIGHT-EMITTING DEVICE AND ORGANIC LIGHT-EMITTING DISPLAY DEVICE

CROSS REFERENCE TO RELATED APPLICATION

This application claims the benefit of Korean Patent Application No. 10-2017-0156596, filed on Nov. 22, 2017, which is hereby incorporated by reference in its entirety as if fully set forth herein.

BACKGROUND

Field of the Disclosure

The present disclosure relates to an organic light-emitting device and organic light-emitting display device, and more particularly, to an organic light-emitting device and an organic light-emitting display device, which are capable of improving the reliability thereof.

Description of the Background

An organic light-emitting device (OLED) is a self-illuminating device and does not require a separate light source, and therefore can be manufactured to have a light and thin profile. In addition, an organic light-emitting device is advantageous in power consumption due to the low-voltage driving thereof, and is excellent in a color implementation, a response speed, a color viewing angle, and a contrast ratio (CR), and therefore has been studied as a next-generation light-emitting device.

An organic material and a metal material, which are included in such an organic light-emitting device, are easily oxidized by external factors, such as moisture ($H_2O$) and oxygen ($O_2$). In particular, when adhesion between a plurality of thin-film layers included in the organic light-emitting device is poor, moisture or oxygen is introduced into an organic layer disposed between an anode electrode and a cathode electrode. When the organic layer is degenerated by the moisture or oxygen, a pixel shrinkage defect, by which each subpixel is blackened from the edge thereof, can occur. In addition, when the pixel shrinkage defect can continuously occur for a long time, this is worsened to become a dark spot defect, by which the entire subpixel area can be blackened, which deteriorates the reliability of the organic light-emitting device.

SUMMARY

Accordingly, the present disclosure is directed to an organic light-emitting device and an organic light-emitting display device that substantially obviate one or more problems due to limitations and disadvantages of the related art.

More specifically, the present disclosure has been provided to solve the problems described above, and the present disclosure is to provide an organic light-emitting device and an organic light-emitting display device, which are capable of improving the reliability thereof.

Additional advantages and features of the disclosure will be set forth in part in the description which follows and in part will become apparent to those having ordinary skill in the art upon examination of the following or may be learned from practice of the disclosure. Other advantages of the disclosure may be realized and attained by the structure particularly pointed out in the written description and claims hereof as well as the appended drawings.

To achieve these and other advantages and in accordance with the purpose of the disclosure, as embodied and broadly described herein, an organic light-emitting device or an organic light-emitting display device includes an organic encapsulation layer disposed on a light-emitting element, and the organic encapsulation layer includes a first organic encapsulation layer disposed on an inorganic encapsulation layer and a second organic encapsulation layer disposed so as to surround the first organic encapsulation layer and including a moisture-absorbent material. As such, it is possible to achieve a reduction in cost and to prevent moisture or oxygen from being introduced from the outside into the side surface of the organic light-emitting device.

In another aspect of the present disclosure, an organic light-emitting device having a substrate where an active area and non-active area are defined, includes an organic light-emitting element disposed at the active area; a first inorganic encapsulation layer disposed on the organic light-emitting element; an organic encapsulation layer disposed on the first inorganic encapsulation layer; and a moisture absorbing layer preventing external moisture from penetrating into lateral sides of the organic light-emitting device and surrounding the first organic encapsulation layer.

It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this application, illustrate aspect(s) of the disclosure and together with the description serve to explain the principle of the disclosure.

In the drawings.

DETAILED DESCRIPTION

Hereinafter, exemplary aspects according to the present disclosure will be described in detail with reference to the accompanying drawings.

Figure 1:
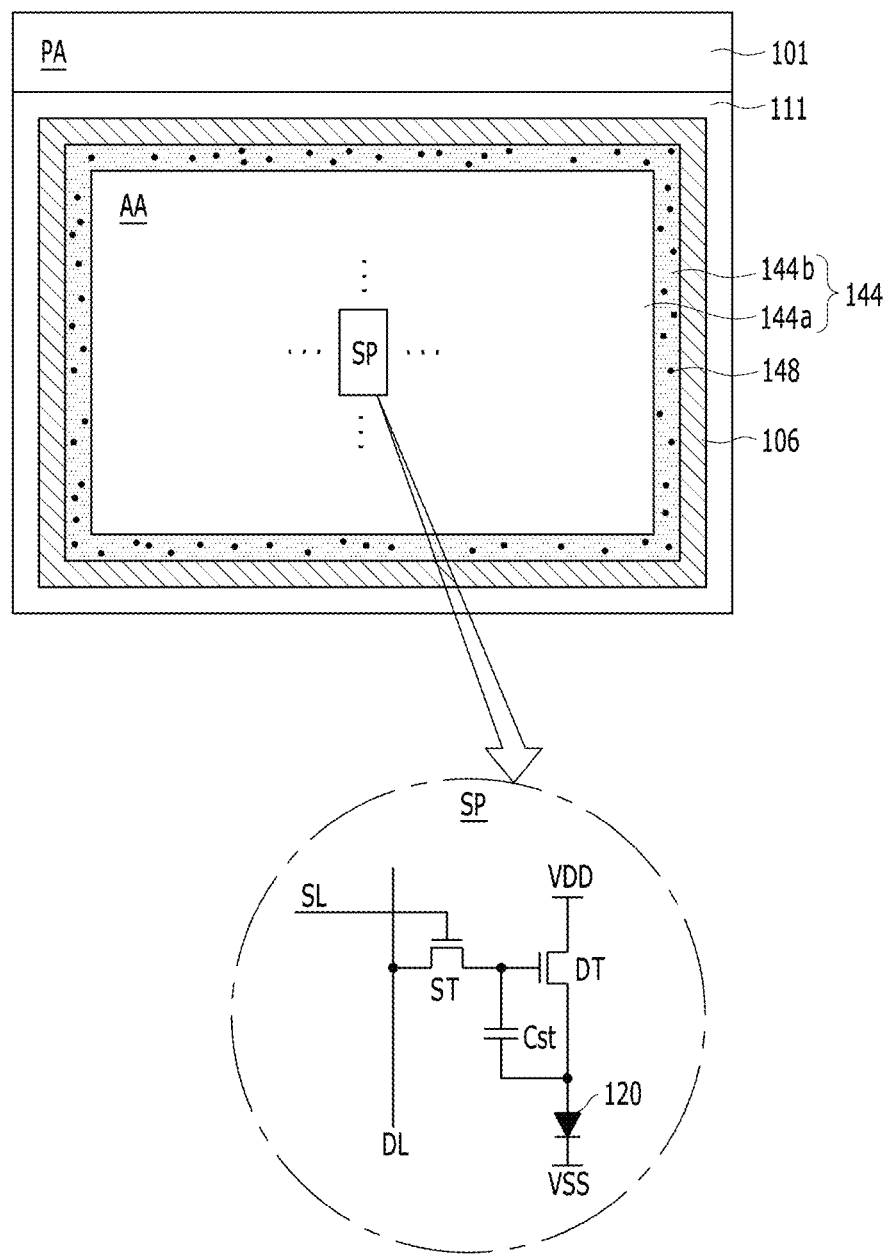
FIG. 1 is a view illustrating an organic light-emitting device according to the present disclosure.
Figure 2:
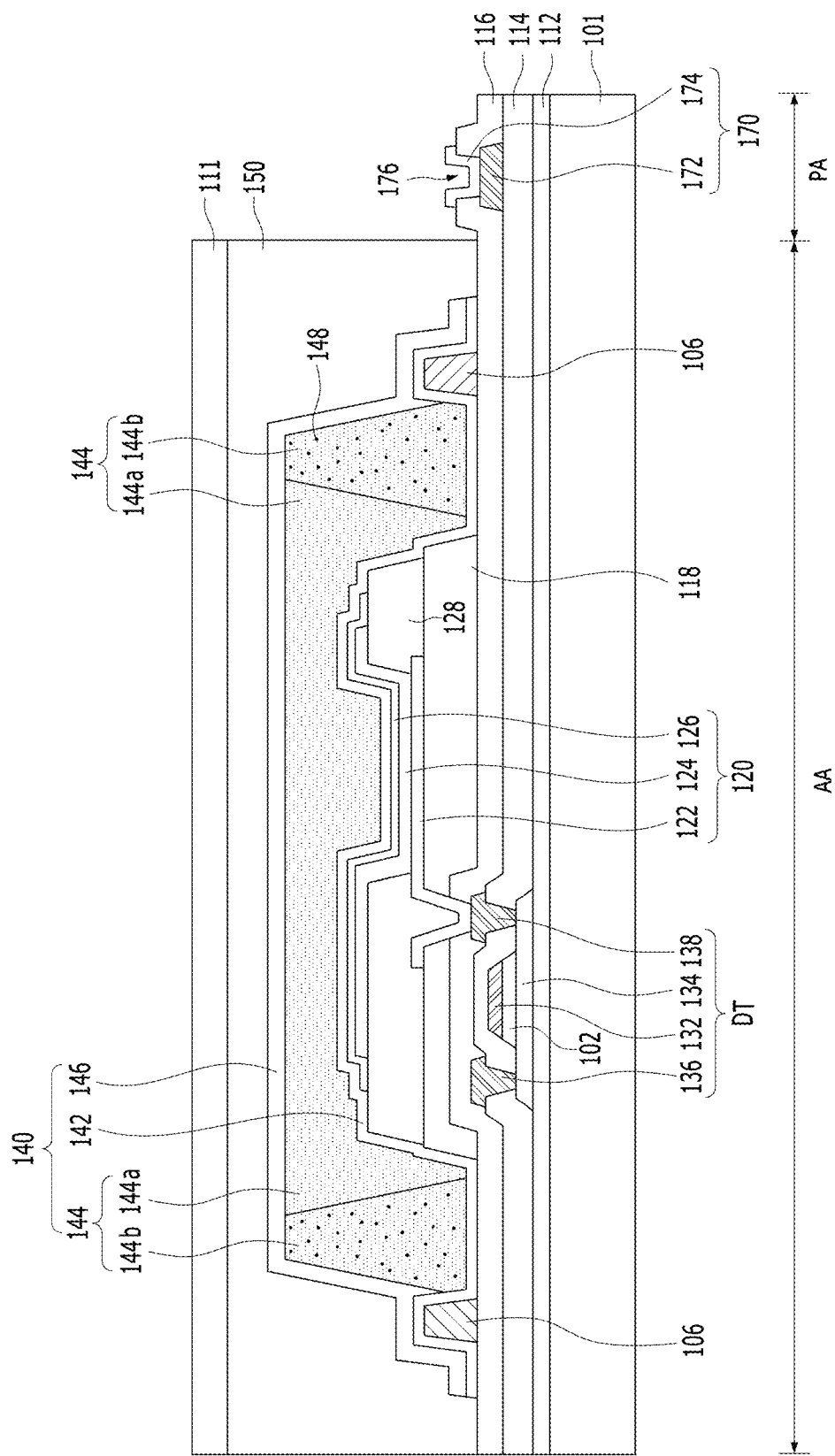
FIG. 2 is a cross-sectional view illustrating the organic light-emitting device of FIG. 1.

An organic light-emitting device, illustrated in FIGS. 1 and 2, includes first and second substrates 101 and 111, which face each other with an organic light-emitting element 120 interposed therebetween.

The first substrate 101 is configured with a glass or plastic substrate having moisture permeation preventing ability. When the first substrate 101 is a plastic substrate, it may be formed of a polyimide-based material or a polycarbonate-based material and may be flexible.

The second substrate 111 is disposed so as to face the first substrate 101. The second substrate 111 is formed to have a size smaller than that of the first substrate 101 and exposes a pad area PA formed in the first substrate 101.

The second substrate 111 is formed of glass, metal, or the like, depending on the direction in which the organic light-emitting device emits light. For example, when the organic light-emitting device has a bottom-emission structure, the second substrate 111 is formed of opaque metal, for example. When the organic light-emitting device has a top-emission structure, the second substrate 111 is formed of transparent glass, for example. The second substrate 111 described above serves to block moisture or oxygen introduced from the outside to the top of the organic light-emitting device.

The first and second substrates 101 and 111 are attached to each other using an adhesive layer 150, which is applied on the entire surface of at least one of the first substrate 101 or the second substrate 111.

The organic light-emitting device, having the first and second substrates 101 and 111 described above, may be defined as an active area AA and the pad area PA.

The pad area PA is provided with a plurality of pads 170, which supplies driving signals to each of a scan line SL, a data line DL, a low-voltage (VSS) supply line, and a high-voltage (VDD) supply line, which are located in the active area AA. The pads 170 are exposed by the second substrate 111, which is formed so as to over the active area AA. Each of the pads 170 includes a pad electrode 172 and a pad cover electrode 174.

The pad electrode 172 is formed of the same material as at least one of a gate electrode 132 or a source electrode 136. The pad electrode 172 is connected to a signal line including the scan line SL, the data line DL, the low-voltage (VSS) supply line, and the high-voltage (VDD) supply line, which are located in the active area AA.

The pad cover electrode 174 is electrically connected to the pad electrode 172, which is exposed through a pad contact hole 176 formed in a protective layer 116. In addition, the pad cover electrode 174 is exposed outwards so as to come into contact with a circuit transmission film, which is connected to a drive circuit. Here, since the pad cover electrode 174 is formed of a metal having high corrosion resistance and acid resistance, it is possible to prevent the pad cover electrode 174 from being corroded by external moisture or the like even when it is exposed outwards by the second substrate 111. For example, the pad cover electrode 174 is formed on the protective layer 116 using the same material as at least one of an anode electrode 122 and a cathode electrode 126. That is, the pad cover electrode 174 is formed of a transparent conductive layer, such as indium-tin-oxide (ITO) and indium-zinc-oxide (IZO), which has high corrosion resistance and acid resistance.

The active area AA is an area in which a plurality of subpixels SP is arranged in a matrix form. Each subpixel SP includes a pixel drive circuit and the organic light-emitting element 120.

The pixel drive circuit includes a switching transistor ST, a driving transistor DT, and a capacitor Cst. Here, the configuration of the pixel drive circuit is not limited to the structure of FIG. 1, and any of various configurations of pixel drive circuits may be used.

The switching transistor ST is turned on under control of the scan line SL to transmit a data voltage from the data line DL to a gate electrode of the driving transistor DT.

The storage capacitor Cst is connected to both a scan terminal of the driving transistor DT and the low-voltage (VSS) supply line to charge a differential voltage therebetween so as to transmit the same as a driving voltage of the driving transistor DT.

The driving transistor DT is switched in response to a data signal supplied from the switching transistor ST to control current flowing from the high-voltage (VDD) supply line to the organic light-emitting element 120. The driving thin-film transistor DT, as illustrated in FIG. 2, includes a semiconductor layer 134 disposed on a buffer layer 112, the gate electrode 132 disposed to overlap the semiconductor layer 134 with a gate insulation layer 102 interposed therebetween, and source and drain electrodes 136 and 138, which are formed on an interlayer insulation layer 114 so as to come into contact with the semiconductor layer 134. Here, the semiconductor layer 134 is formed of at least one of an amorphous semiconductor material, a polycrystalline semiconductor material, and an oxide semiconductor material.

The organic light-emitting element 120 is located between a source terminal of the driving transistor DT and the low-voltage (VSS) supply line and is electrically connected thereto to emit light using current, which corresponds to the data signal supplied from the driving transistor DT. To this end, the organic light-emitting element 120 includes the anode electrode 122 connected to the source terminal of the driving transistor DT, an organic layer 124 formed on the anode electrode 122, and the cathode electrode 126 formed on the organic layer 124.

The anode electrode 122 is electrically connected to the drain electrode 138 of the driving thin-film transistor DT, which is exposed through a pixel contact hole formed in the protective layer 116 and a pixel planarization layer 118.

The organic layer 124 is formed on the anode electrode 122 in a light-emitting area defined by a bank 128. The organic layer 124 may include a hole injection layer, a hole transport layer, an emission layer, an electron transport layer, and an electron injection layer.

The cathode electrode 126 is formed so as to face the anode electrode 122 with the organic layer 124 interposed therebetween, and is connected to the low-voltage (VSS) supply line. When the organic light-emitting device, including the cathode electrode 126, the organic layer 124, and the anode electrode 122, has a top-emission structure, the cathode electrode 126 is formed of a transparent conductive layer, such as indium-tin-oxide (ITO) or indium-zinc-oxide (IZO), and the anode electrode 122 is formed of an opaque conductive layer, which is formed in a single layer or in multiple layers using Al, Ag, Cu, Pb, Mo, Ti, or an alloy thereof. For example, the anode electrode 122 takes the form of a stack including a transparent conductive layer, an opaque conductive layer, and a transparent conductive layer, which are sequentially stacked. In addition, when the organic light-emitting device has a bottom-emission structure, the anode electrode 122 is formed of a transparent conductive layer, and the cathode electrode 126 is formed in a single layer or in multiple layers using an opaque conductive layer.

An encapsulation stack 140 prevents external moisture or oxygen from being introduced into the organic light-emitting element 120, which is vulnerable to external moisture or oxygen. To this end, the encapsulation stack 140 includes a plurality of inorganic encapsulation layers 142 and 146 and an organic encapsulation layer 144 disposed between the inorganic encapsulation layers 142 and 146, and the inorganic encapsulation layer 146 is disposed in the uppermost layer. Here, the encapsulation stack 140 includes at least two inorganic encapsulation layers 142 and 146 and at least one organic encapsulation layer 144. In the present disclosure, the structure of the encapsulation stack 140 in which the organic encapsulation layer 144 is disposed between first and second inorganic encapsulation layers 142 and 146 will be described by way of example.

The first inorganic encapsulation layer 142 is formed on the first substrate 101, on which the cathode electrode 126 is formed, so as to be closest to the organic light-emitting element 120. The first inorganic encapsulation layer 142 is formed of an inorganic insulation material that enables low-temperature deposition, such as silicon nitride (SiNx), silicon oxide (SiOx), silicon oxide nitride (SiON), and aluminum oxide ($Al_2O_3$). Thereby, since the first inorganic encapsulation layer 142 is deposited under a low-temperature atmosphere, it is possible to prevent damage to the organic layer 124, which is vulnerable to a high-temperature atmosphere during deposition of the first inorganic encapsulation layer 142.

The organic encapsulation layer 144 includes a first organic encapsulation layer 144a and a second organic encapsulation layer 144b disposed so as to surround the first organic encapsulation layer 144a.

The first organic encapsulation layer 144a is disposed on the first inorganic encapsulation layer 142 so as to have an area smaller than that of the first inorganic encapsulation layer 142. The first organic encapsulation layer 144a is formed of an organic insulation material such as acryl resin, epoxy resin, polyimide, polyethylene, and silicon oxycarbon (SiOC). Thereby, the first organic encapsulation layer 144a serves to alleviate stress between the respective layers caused by repetitive bending of the organic light-emitting device, and increases planarization performance.

The second organic encapsulation layer 144b is located outside the first organic encapsulation layer 144a and is formed so as to surround the first organic encapsulation layer 144a. The second organic encapsulation layer 144b includes a moisture-absorbent material 148 in order to adsorb or remove moisture, oxygen or the like introduced into the side surface of the organic light-emitting device. That is, the second organic encapsulation layer 144b includes the organic insulation material and the moisture-absorbent material 148.

The organic insulation material of the second organic encapsulation layer 144b may be formed of the same material as or a different material from the organic insulation material of the first organic encapsulation layer 144a. For example, the second organic encapsulation layer 144b may be formed of acryl resin, epoxy resin, polyimide, polyethylene, or silicon oxycarbon (SiOC).

The moisture-absorbent material 148 may include a moisture-absorbent material such as silica including hollow silica, zeolite, titania, zirconia, or montmorillonite, a metal salt, and a metal oxide, or the like alone, or a mixture of two or more ones thereof.

Here, the metal oxide may include a metal oxide such as lithium oxide ($Li_2O$), sodium oxide ($Na_2O$), barium oxide (BaO), calcium oxide (CaO), and magnesium oxide (MgO), an organic metal oxide, phosphorous pentoxide ($P_2O_5$), or the like alone or a mixture of two or more ones thereof.

In addition, the metal salt includes a sulfate such as lithium sulfate ($Li_2SO_4$), sodium sulfate ($Na_2SO_4$), calcium sulfate ($CaSO_4$), magnesium sulfate ($MgSO_4$), cobalt sulfate ($CoSO_4$), gallium sulfate ($Ga_2(SO_4)_3$), titanium sulfate ($Ti(SO_4)_2$), or nickel sulfate ($NiSO_4$), a metal halide such as calcium chloride ($CaCl_2$), magnesium chloride ($MgCl_2$), strontium chloride ($SrCl_2$), yttrium chloride ($YCl_3$), copper chloride ($CuCl_2$), cesium fluoride (CsF), tantalum fluoride ($TaF_5$), niobium fluoride ($NbF_5$), lithium bromide (LiBr), calcium bromide ($CaBr_2$), cesium bromide ($CeBr_3$), selenium bromide ($SeBr_4$), vanadium bromide ($VBr_3$), magnesium bromide ($MgBr_2$), barium iodide ($BaI_2$), or magnesium iodide ($MgI_2$), a metal perchlorate such as barium perchlorate ($Ba(ClO_4)_2$) and magnesium perchlorate ($Mg(ClO_4)_2$), or the like alone, or a mixture of two or more ones thereof. The moisture-absorbent material 148 is not limited to the above-described exemplary materials.

As described above, in the present disclosure, the moisture-absorbent material 148 is included in the second organic encapsulation layer 144b, which is disposed closer to a dam 106 than the first organic encapsulation layer 144a. Here, external moisture, oxygen, or the like is not introduced through the first and second substrates 101 and 111, which are formed of an inorganic material, but is introduced through the adhesive layer 150, which is formed of an organic material. Dark spots, which are generated due to external moisture or oxygen introduced through the adhesive layer 150, are not visible from the central portion of the organic light-emitting device, but are visible only through the side surface of the organic light-emitting device to thereby be diffused. Therefore, in the present disclosure, the moisture-absorbent material 148 is included only in the second organic encapsulation layer 144b, rather than in the first organic encapsulation layer 144a, which is located in the central portion of the organic light-emitting device. Thereby, the organic light-emitting device of the present disclosure may prevent dark spots from becoming visible due to external moisture, oxygen, or the like introduced through the side surface thereof and may reduce the amount of use of the moisture-absorbent material 148, which is expensive, which may result in a reduction in cost.

Figure 3A:
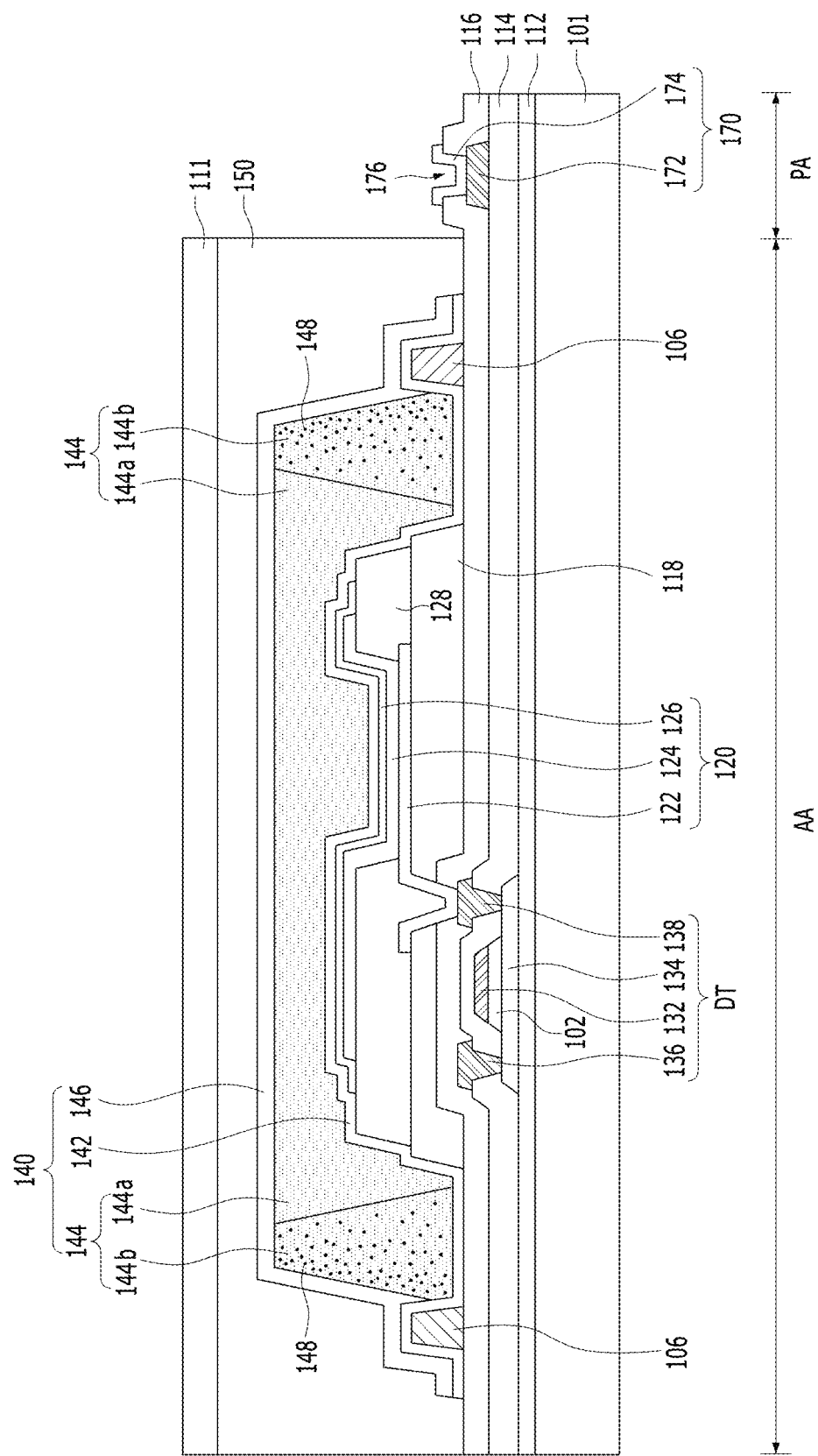
FIGS. 3A and 3B are cross-sectional views illustrating other aspects of the organic light-emitting device according to the present disclosure.

The moisture-absorbent material 148 of the second organic encapsulation layer 144b described above, as illustrated in FIG. 2, is uniformly formed in the second organic encapsulation layer 144b. Alternatively, as illustrated in FIG. 3A, the density of the moisture-absorbent material 148 may gradually increase from the side surface of the first organic encapsulation layer 144a toward the side surface of the dam 106. In this case, since the amount of the moisture-absorbent material 148 increases with decreasing distance to the outer surface of the organic light-emitting device, it is possible to effectively prevent the introduction of external moisture, oxygen, or the like.

Figure 3B:
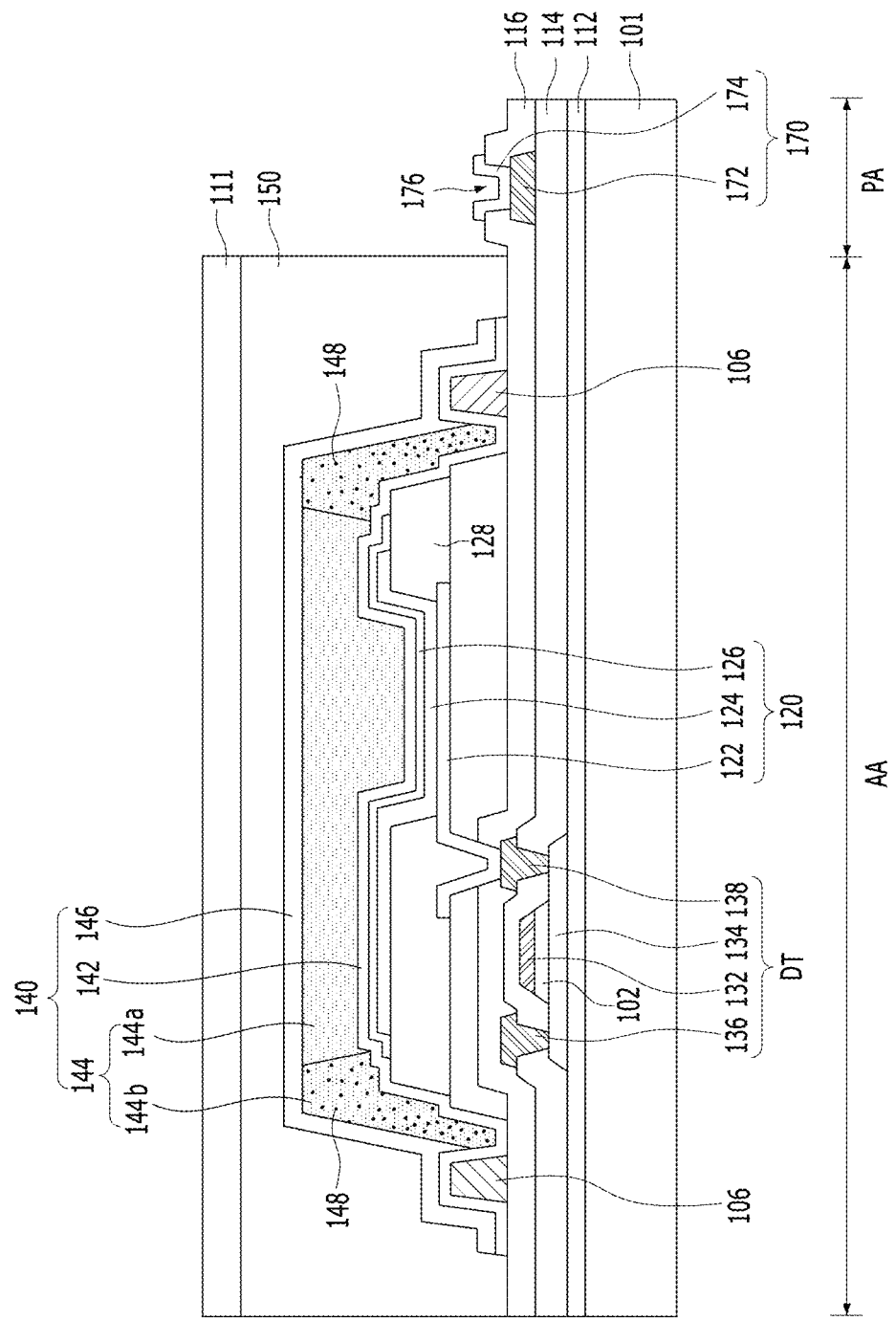

The structure in which the second organic encapsulation layer 144b is disposed between the bank 128 and the dam 106 has been described above with reference to FIG. 2 by way of example. The second organic encapsulation layer 144b, which is disposed between the bank 128 and the dam 106 as illustrated in FIG. 2, may be applied both to the top-emission-type organic light-emitting device and to the bottom-emission-type organic light-emitting device. When the second organic encapsulation layer 144b is applied to the top-emission-type organic light-emitting device in which light is emitted from the second substrate 111, in order to prevent a reduction in aperture ratio due to the second organic encapsulation layer 144b, the second organic encapsulation layer 144b is not formed in the light-emitting area in which the organic light-emitting element 120 is disposed, but is formed in a bezel area that surrounds the active area AA. Here, a scan drive unit for driving the scan line SL or the like is disposed in the bezel area. In addition, when the second organic encapsulation layer 144b is applied to the bottom-emission-type organic light-emitting device in which light is emitted from the first substrate 101, the second organic encapsulation layer 144b is formed in at least one of the bezel area or the light-emitting area in which the organic light-emitting element 120 is disposed. For example, the second organic encapsulation layer 144 may be formed so as to overlap the bank 128 of outermost subpixels, as illustrated in FIG. 3B, or may be formed so as to overlap the organic layer 124 and the bank of outermost subpixels.

When the organic encapsulation layer 144, including the first and second organic encapsulation layers 144a and 144b, is formed by an inkjet method, the dam 106 is disposed in order to prevent the organic encapsulation layer 144 in a liquid form from being diffused to the edge of the substrate 111. That is, the dam 106 is disposed so as to surround the second organic encapsulation layer 144b. Through the provision of the dam 106, it is possible to prevent the organic encapsulation layer 144 from being diffused to the outermost pad area PA of the substrate 111 in which the signal pads 170 are disposed. To this end, the dam 106 may be formed so as to fully surround the active area AA in which the organic light-emitting element 120 is disposed, as illustrated in FIG. 1, or may be formed only between the active area AA and the pad area PA. In the present disclosure, the structure in which a single dam 106 is provided to surround the active area AA, as illustrated in FIGS. 1 and 2, has been described by way of example, but a plurality of dams may be spaced apart from each other by a predetermined distance and may be arranged parallel to each other.

The dam 106 is formed in a single layer or in multiple layers. For example, the dam 106 is formed simultaneously with at least one of the bank 128 or a spacer (not illustrated) using the same material, which may obviate an additional mask process and prevent an increase in cost.

The second inorganic encapsulation layer 146 is formed on the substrate 111 having the organic encapsulation layer 144 formed thereon, so as to cover the upper surface and the side surface of the organic encapsulation layer 144. Thereby, the second inorganic encapsulation layer 146 minimizes or prevents external moisture or oxygen from being introduced into the first inorganic encapsulation layer 142 and the organic encapsulation layer 144. The second inorganic encapsulation layer 142 is formed of an inorganic insulation material, such as silicon nitride (SiNx), silicon oxide (SiOx), silicon oxide nitride (SiON), and aluminum oxide ($Al_2O_3$).

As described above, in the organic light-emitting device of the present disclosure, the second organic encapsulation layer 144b including the moisture-absorbent material 148 is disposed so as to surround the side surface of the active area AA, and the second substrate 111 is formed of glass or a metal material. Thereby, the second organic encapsulation layer 144b of the present disclosure prevents moisture or oxygen from being introduced from the outside into the side surface of the organic light-emitting device, and the second substrate 111 prevents moisture or oxygen from being introduced from the outside into the upper surface of the organic light-emitting device, which results in improved reliability.

Figure 4A:
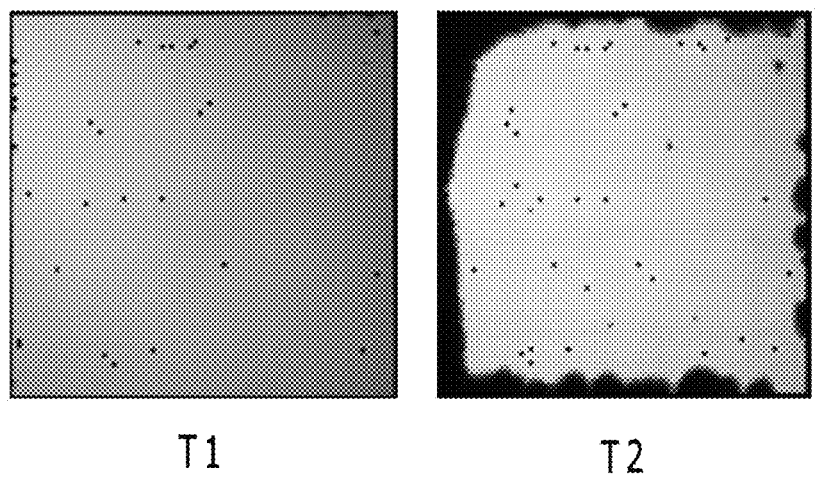
FIGS. 4A and 4B are views illustrating experimental results of the reliability of organic light-emitting devices according to a comparative example and an example of the present disclosure.
Figure 4B:
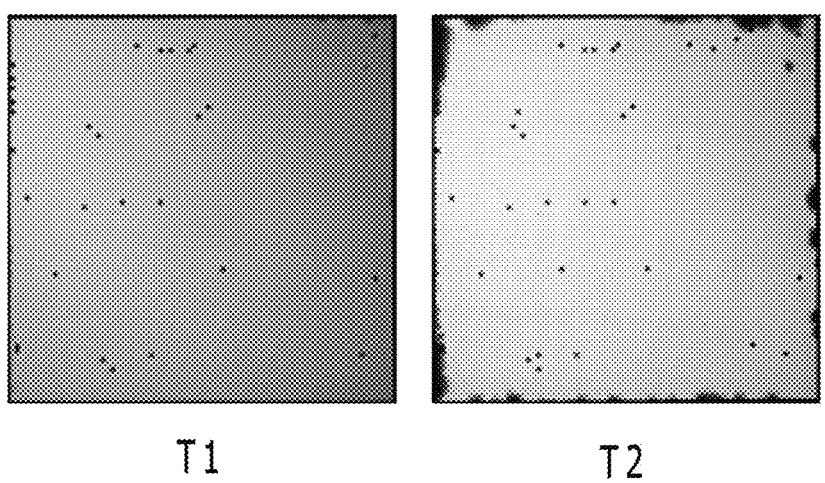

FIGS. 4A and 4B are views illustrating experimental results of reliability according to a comparative example in which an organic encapsulation layer includes no moisture-absorbent material and according to an example of the present disclosure in which an organic encapsulation layer includes a moisture-absorbent material.

In the case of the comparative example having no moisture-absorbent material, as illustrated in FIG. 4A, it can be appreciated that, when the organic light-emitting device is used for a predetermined amount of time (from T1 to T2), dark spots are rapidly diffused from the side surface to the central portion of the organic light-emitting device. On the other hand, in the case of the example in which the second organic encapsulation layer 144b includes the moisture-absorbent material 148, it can be appreciated that, when the organic light-emitting device is used for a predetermined amount of time (from T1 to T2), dark spots are diffused from the side surface to the central portion of the organic light-emitting device, but the diffusion rate of dark spots is slower than that in the comparative example.

In this way, in the example of the present disclosure, the moisture-absorbent material 148 in the second organic encapsulation layer 144b may adsorb or remove moisture, oxygen, or the like introduced from the side surface of the organic light-emitting device, thereby being capable of reducing the diffusion rate of dark spots, compared to that in the comparative example. Thereby, it can be appreciated that the present disclosure achieves improved reliability compared to the comparative example.

Figure 5A:
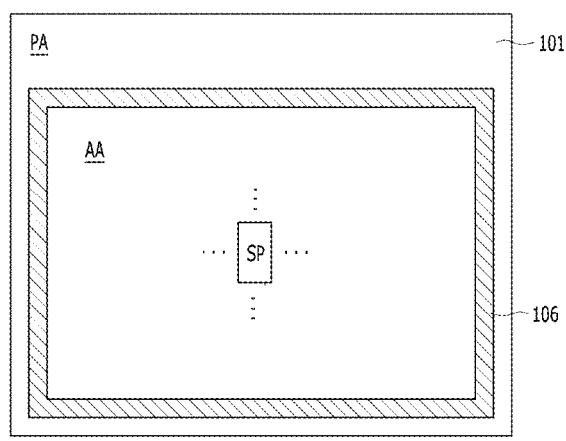
FIGS. 5A to 5C are views for explaining a method of manufacturing the organic light-emitting device illustrated in FIG. 2.
Figure 5A:
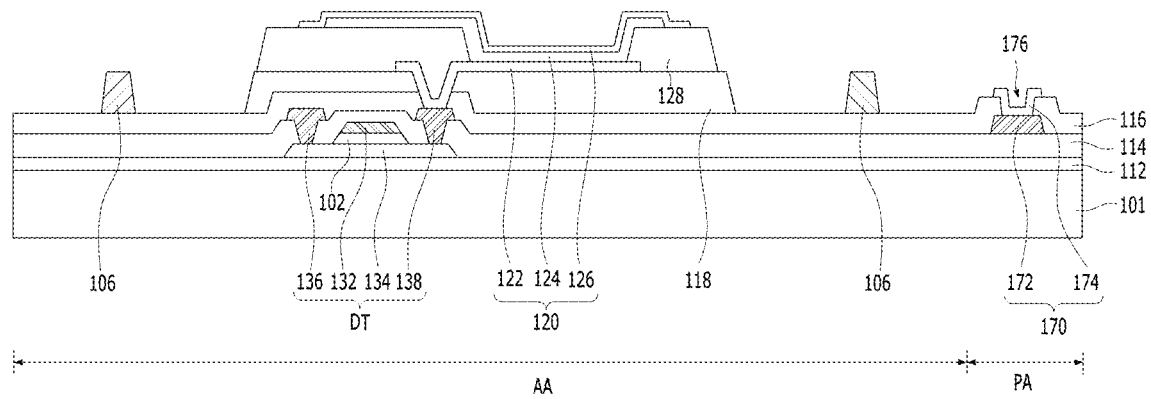
Figure 5B:
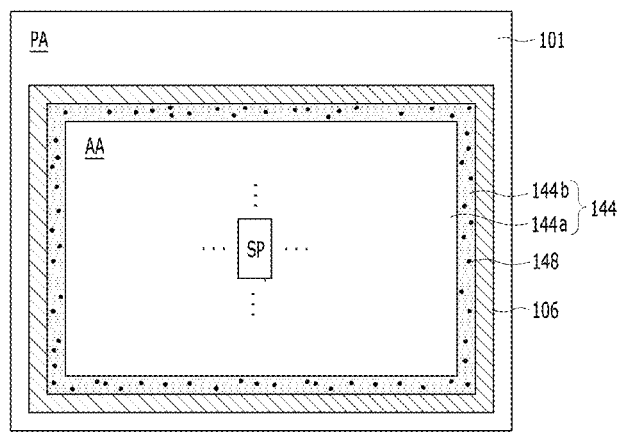
Figure 5B:
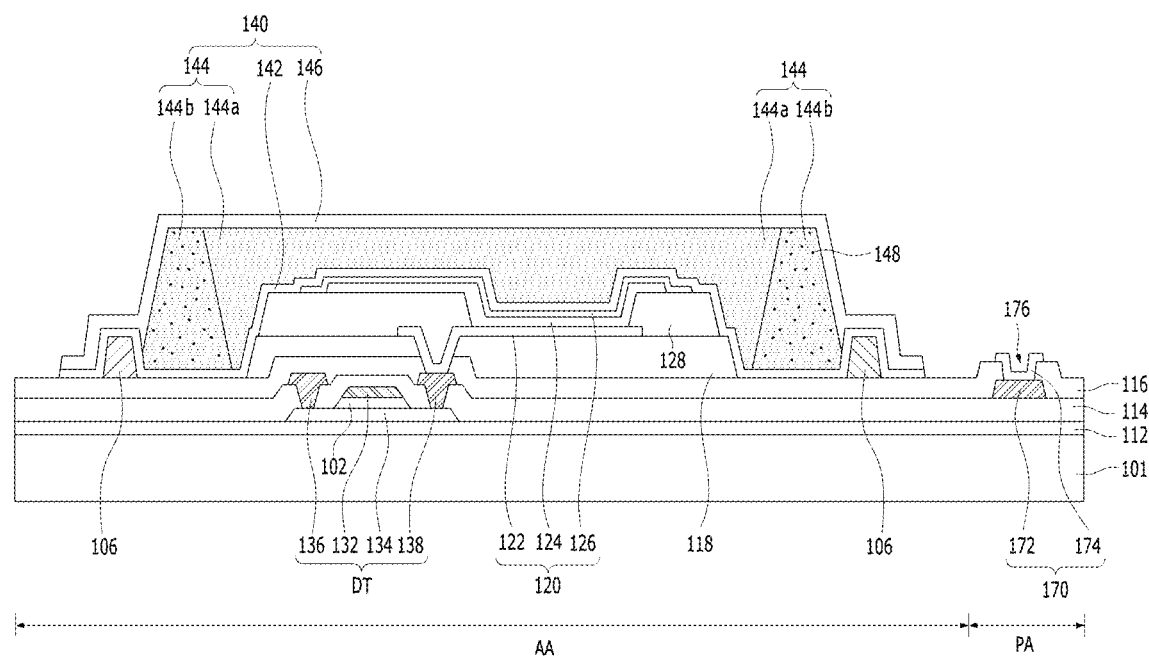
Figure 5C:
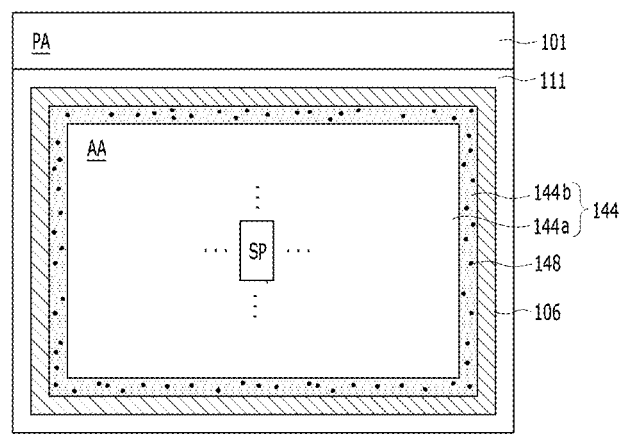
Figure 5C:
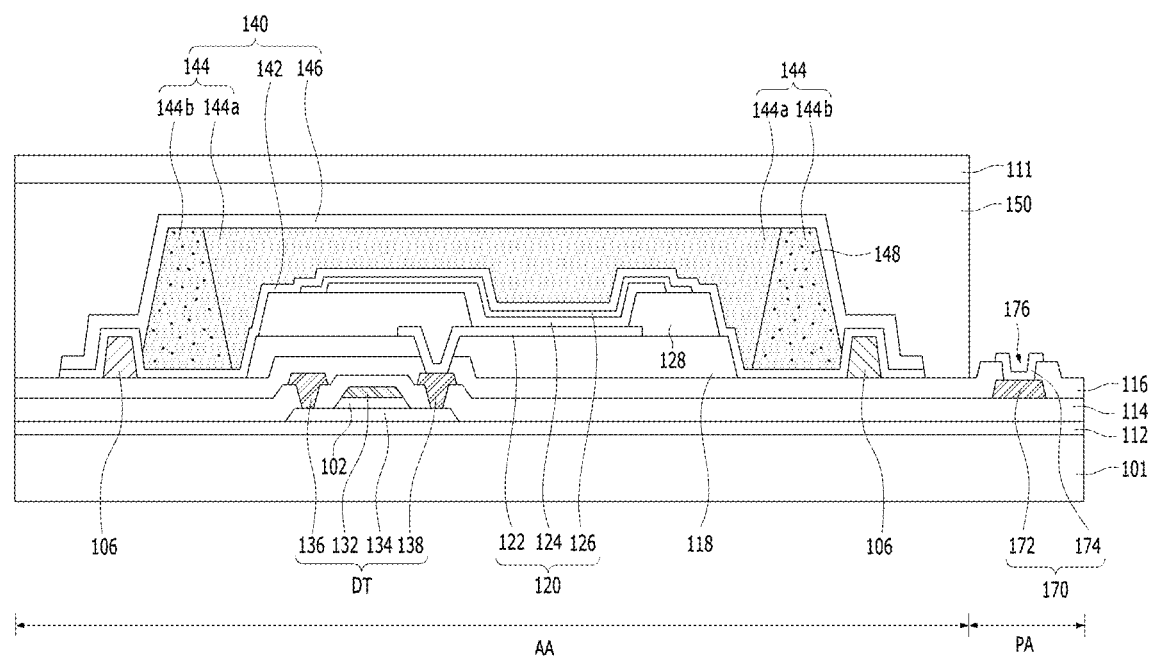

FIGS. 5A to 5C are views for explaining a method of manufacturing the organic light-emitting device according to the present disclosure.

First, as illustrated in FIG. 5A, the thin-film transistors ST and DT having the active layer 134, the organic light-emitting element 120, the dam 106, and the signal pad 170 are formed on the first substrate 101 through a plurality of mask processes.

Subsequently, as illustrated in FIG. 5B, the first inorganic encapsulation layer 142 is formed on the substrate 101 having the organic light-emitting element 120 formed thereon by a deposition method, such as chemical vapor deposition (CVD), low pressure chemical vapor deposition (LPCVD), or plasma enhanced chemical vapor deposition (PECVD). Here, the first inorganic encapsulation layer 142 is formed of SiOx, SiNx, or SiON. Subsequently, an organic insulation material is coated over the first substrate 101 having the first inorganic encapsulation layer 142 formed thereon so as to form the first organic encapsulation layer 144a, and thereafter an organic insulation material including the moisture-absorbent material 148 is coated to surround the first organic encapsulation layer 144 so as to form the second organic encapsulation layer 144b. Here, the organic insulation material of the first and second organic encapsulation layers 144a and 144b may be acryl resin, epoxy resin, polyimide, polyethylene, or silicon oxycarbon (SiOC). Although the method of forming the second organic encapsulation layer 144b after the first organic encapsulation layer 144a is formed has been described above by way of example, the second organic encapsulation layer 144b may first be formed, and thereafter, the first organic encapsulation layer 144a may be formed by an inkjet method. In this case, the side surface of the second organic encapsulation layer 144b may be tapered at an acute angle, and the side surface of the first organic encapsulation layer 144a may be inversely tapered at an obtuse angle.

Subsequently, when the second inorganic encapsulation layer 146 is formed on the first substrate 101 having the organic encapsulation layer 144 formed thereon through the above-described deposition process, the encapsulation stack 140 having a multilayer structure is formed.

Subsequently, after the adhesive layer 150 is transferred to at least one of the first substrate 101 having the encapsulation stack 140 formed thereon or the second substrate 111, as illustrated in FIG. 5C, the second substrate 111 is heated and is compressed onto the first substrate 101 having the encapsulation stack 140 formed thereon. Thereby, the first and second substrates 101 and 111 are attached to each other via the adhesive layer 150, whereby the organic light-emitting device is completed.

Although the organic light-emitting device, which includes a pixel drive circuit for each subpixel SP and is driven in an active matrix manner, has been described in the present disclosure by way of example, the present disclosure may also be applied to an organic light-emitting device, which is driven in a passive matrix manner without a pixel drive circuit for each subpixel SP.

In addition, the organic light-emitting device of the present disclosure may be applied to various fields including a lighting apparatus or a display device that displays an image.

As is apparent from the above description, according to the aspects of the present disclosure, a second organic encapsulation layer including a moisture-absorbent material is disposed so as to surround a first organic encapsulation layer, and a second substrate is formed of glass or a metal material having moisture permeation preventing ability. Thereby, the second organic encapsulation layer of the present disclosure prevents moisture or oxygen from being introduced from the outside into the side surface of an organic light-emitting device, and the second substrate prevents moisture or oxygen from being introduced from the outside into the upper surface of the organic light-emitting device, which results in improved reliability. In addition, in the present disclosure, the moisture-absorbent material is included only in the second organic encapsulation layer, other than the first organic encapsulation layer located in the central portion of the organic light-emitting device. Thereby, the organic light-emitting device of the present disclosure may prevent dark spots from becoming visible due to external moisture, oxygen, or the like introduced through the side surface thereof and may reduce the amount of use of the moisture-absorbent material, which is expensive, which may result in a reduction in cost.

Although the aspects of the present disclosure have been described above in detail with reference to the accompanying drawings, it will be apparent to those skilled in the art that the present disclosure described above is not limited to the aspects described above, and various substitutions, modifications, and alterations may be devised within the spirit and scope of the present disclosure. Thus, the aspects disclosed in the specification of the present disclosure are not intended to limit the present disclosure, and the technical scope of the present disclosure should be interpreted based on the following claims, and all technical ideas that fall within the range equivalent to the claims should be understood as belonging to the scope of the present disclosure.

What is claimed is:

1. An organic light-emitting device comprising:
a light-emitting element disposed on an active area of a substrate; and
an encapsulation stack disposed on the light-emitting element and including a plurality of inorganic encapsulation layers and at least one organic encapsulation layer disposed between the inorganic encapsulation layers,
wherein the at least one organic encapsulation layer includes:
a first organic encapsulation layer disposed on the plurality of inorganic encapsulation layers; and
a second organic encapsulation layer surrounding the first organic encapsulation layer and including a moisture-absorbent material dispersed in the second organic encapsulation layer.

2. The device according to claim 1, further comprising a dam surrounding the second organic encapsulation layer.

3. The device according to claim 2, wherein the second organic encapsulation layer is disposed between the dam and the first organic encapsulation layer.

4. The device according to claim 2, wherein the moisture-absorbent material is gradually increased in density from a side surface of the first organic encapsulation layer to a side surface of the dam.

5. The device according to claim 1, wherein the light-emitting element comprises:
an anode electrode disposed on the substrate;
a cathode electrode facing the anode electrode; and
an organic layer disposed between the anode electrode and the cathode electrode, and
wherein the second organic encapsulation layer overlaps a bank defining a light-emitting area of the organic layer, or overlaps the bank and the organic layer.

6. An organic light-emitting display device comprising:
a thin film transistor on a substrate;
a light-emitting element disposed on an active area of the substrate and connected to the thin film transistor; and
an encapsulation stack disposed on the light-emitting element and including a plurality of inorganic encapsulation layers and at least one organic encapsulation layer disposed between the inorganic encapsulation layers,
wherein the at least one organic encapsulation layer includes:
a first organic encapsulation layer disposed on the inorganic encapsulation layer; and
a second organic encapsulation layer surrounding the first organic encapsulation layer and including a moisture-absorbent material dispersed in the second organic encapsulation layer.

7. The display device according to claim 6, further comprising a dam surrounding the second organic encapsulation layer.

8. The display device according to claim 7, wherein the second organic encapsulation layer is disposed between the dam and the first organic encapsulation layer.

9. The display device according to claim 7, wherein the moisture-absorbent material is gradually increased in density from a side surface of the first organic encapsulation layer to a side surface of the dam.

10. The display device according to claim 6, wherein the light-emitting element comprises:
an anode electrode disposed on the substrate;
a cathode electrode disposed so as to face the anode electrode; and
an organic layer disposed between the anode electrode and the cathode electrode, and
wherein the second organic encapsulation layer overlaps a bank defining a light-emitting area of the organic layer, or overlaps the bank and the organic layer.

11. An organic light-emitting device having a substrate where an active area and non-active area are defined, comprising:
an organic light-emitting element disposed at the active area;
a first inorganic encapsulation layer disposed on the organic light-emitting element;
a first organic encapsulation layer disposed on the first inorganic encapsulation layer; and a moisture absorbing layer preventing external moisture from penetrating into lateral sides of the organic light-emitting device and surrounding the first organic encapsulation layer, wherein the moisture absorbing layer is a second organic encapsulating layer including a moisture-adsorbent material dispersed in the second organic encapsulation layer.

12. The device according to claim 11, further comprising a dam surrounding the moisture absorbing layer and preventing the moisture and oxygen absorbing layer from spreading out.

13. The device according to claim 12, wherein the moisture absorbing layer is formed of a moisture absorbent dispersed in an organic layer.

14. The device according to claim 12, wherein the moisture absorbing layer is disposed between the dam and the organic encapsulation layer.

15. The device according to claim 12, wherein the moisture-absorbent material is gradually increased in density from a side surface of the organic encapsulation layer to a side surface of the dam.

16. The device according to claim 11, wherein the organic light-emitting element comprises:
   an anode electrode disposed on the substrate;
   a cathode electrode facing the anode electrode; and
   an organic layer disposed between the anode electrode and the cathode electrode, and
   a bank defining a light-emitting area of the organic light-emitting element.

17. The device according to claim 16, wherein bank has a portion vertically overlapping the moisture absorbing layer and the organic layer.

18. The device according to claim 12, wherein the moisture absorbing layer is disposed closer to the dam than the organic encapsulation layer.

19. The device according to claim 11, wherein the moisture absorbing layer has a tapered side surface at an acute angle.

20. The device according to claim 11, wherein the organic encapsulation layer has an inversely tapered side surface at an obtuse angle.

* * * * *